(12) United States Patent
Abe et al.

(10) Patent No.: US 9,001,054 B2
(45) Date of Patent: Apr. 7, 2015

(54) IMAGE DISPLAY DEVICE

(75) Inventors: Hideaki Abe, Chiba (JP); Setsuo Kobayashi, Mobara (JP); Hironobu Abe, Chiba (JP)

(73) Assignees: Japan Display Inc., Tokyo (JP); Panasonic Liquid Crystal Display Co., Ltd., Himeji-Shi, Hyogo (JP)

( * ) Notice: Subject to any disclaimer, the term of this patent is extended or adjusted under 35 U.S.C. 154(b) by 402 days.

(21) Appl. No.: 13/280,420

(22) Filed: Oct. 25, 2011

(65) Prior Publication Data
US 2012/0098774 A1    Apr. 26, 2012

(30) Foreign Application Priority Data
Oct. 26, 2010    (JP) ................ 2010-239621

(51) Int. Cl.
| G06F 3/041 | (2006.01) |
|---|---|
| H05K 1/02 | (2006.01) |
| G02F 1/1333 | (2006.01) |
| H05K 1/14 | (2006.01) |
| G02F 1/1345 | (2006.01) |
| H05K 3/36 | (2006.01) |

(52) U.S. Cl.
CPC .......... H05K 1/028 (2013.01); G02F 1/133308 (2013.01); G02F 1/13338 (2013.01); H05K 1/147 (2013.01); G02F 1/13452 (2013.01); H05K 3/361 (2013.01); H05K 2201/053 (2013.01)

(58) Field of Classification Search
CPC ....... G06F 3/041; G06F 3/0416; G06F 3/045; G02F 1/1333
USPC ................ 345/173–178; 178/18.01–18.08
See application file for complete search history.

(56) References Cited

U.S. PATENT DOCUMENTS

| 7,268,770 B1 * | 9/2007 | Takahata et al. ............... 345/173 |
| 8,034,261 B2 * | 10/2011 | Kim et al. ..................... 252/511 |
| 2010/0253647 A1 * | 10/2010 | Agari et al. .................. 345/174 |
| 2011/0012845 A1 * | 1/2011 | Rothkopf et al. ............. 345/173 |

FOREIGN PATENT DOCUMENTS

| JP | 2003-280541 | 10/2003 |
| JP | 2005-38231 | 2/2005 |

* cited by examiner

*Primary Examiner* — Amare Mengistu
*Assistant Examiner* — Stacy Khoo
(74) *Attorney, Agent, or Firm* — Lowe Hauptman & Ham, LLP

(57) ABSTRACT

A liquid crystal display device having a liquid crystal panel LCP and a touch panel TP provided on the front surface of the liquid crystal panel is characterized in that wires connected to the liquid crystal panel and wires connected to the touch panel are included in one flexible printed circuit FPC, which is first connected (FOG1) to the liquid crystal panel (specifically, a TFT substrate (TFTS)) and then connected (FOG2) to the touch panel.

10 Claims, 10 Drawing Sheets

IMAGE DISPLAY DEVICE

CROSS-REFERENCE TO RELATED APPLICATION

The present application claims priority over Japanese Application JP 2010-239621 filed on Oct. 26, 2010, the contents of which are hereby incorporated into this application by reference.

BACKGROUND OF THE INVENTION (1) Field of the Invention

The present invention relates to an image display device, and in particular to an image display device having an image display panel, such as a liquid crystal panel or an organic electroluminescent panel, and a touch panel.

(2) Description of the Related Art

Thin image display devices, such as liquid crystal modules (liquid crystal display devices) and organic electroluminescent modules (organic EL display devices), are used for the display devices of many portable information apparatuses, such as cellular phones, personal data assistants (PDAs), digital cameras and multimedia players.

FIG. 1 is a perspective diagram showing an example of a liquid crystal display device that is formed of a liquid crystal panel and a backlight unit BLU for illuminating the liquid crystal panel. DA represents the display region of the liquid crystal panel. The liquid crystal panel has a TFT substrate (TFTS) on which switching elements made of thin film transistors and electrodes are provided and a color filter substrate (facing substrate, CFS) on which color filters are formed, and liquid crystal is sealed in between the TFT substrate and the color filter substrate. A driver chip (DRC) for driving the liquid crystal panel is mounted on part of the TFT substrate. In addition, the liquid crystal panel has an upper polarizing plate (UPP) provided on the upper side of the color filter substrate and a lower polarizing plate (not shown) provided on the lower side of the TFT substrate. Furthermore, the wires connected to the liquid crystal panel are included in a flexible printed circuit (FPC) as shown in FIG. 1. The organic EL display device also uses a TFT substrate where the wires are connected in an FPC.

Recently, image display devices having a touch panel have been proposed in order to make the operation of information apparatuses easier. FIG. 2 is a perspective diagram showing a touch panel where touch panel electrodes (TPE) are formed on one side of a touch panel substrate (transparent substrate, TPS). The wires connected to the touch panel are included in a flexible printed circuit (FPC) on which a driving IC for driving the touch panel is mounted. IFT represents the interface of the flexible printed circuit.

FIG. 3 shows an example of a liquid crystal display device having a touch panel. A front panel (FW) for protecting a liquid crystal panel LCP and a touch panel TP are provided, and the touch panel TP and the liquid crystal panel LCP are provided in this order on the rear surface. Thus, the touch panel and the liquid crystal panel are provided in proximity, and therefore there are many wires in a small space which makes it difficult to make the liquid crystal display device thinner. The same problem arises in organic EL display devices.

JP 2003-280541A discloses a number of liquid crystal panels that are implemented by using one flexible printed circuit in order to provide display devices on the two sides, front and rear. The present inventor examined the method for implementing a touch panel and a liquid crystal panel connected through one flexible printed circuit and found that there is no space for the backlight between the touch panel and the liquid crystal panel as in JP 2003-280541A. Therefore, the distance between the terminals for the liquid crystal panel on the flexible printed circuit and the terminals for the touch panel is short, which makes it difficult to connect the flexible printed circuit to the liquid crystal panel and the touch panel with high precision.

In addition, the connection between the flexible printed circuit and the liquid crystal panel (portion represented by FOG in FIG. 3) is made by an FOG contact bond where the two are connected through the application of pressure and heat with an anisotropic conductive film in between. Therefore, the flexible printed circuit is connected to one panel, and after that the flexible printed circuit is connected to the other panel when it is found that the previous connection might slide or disengage due to the heat applied for the FOG contact bond, which leads to a problem.

In addition, JP 2005-38231A discloses a touch panel attached to one branch of an FPC and a liquid crystal display device attached to the other branch in order to reduce the number of connection cables so that the cost for parts and cost for assembly can be reduced. Furthermore, JP 2005-38231A discloses a touch panel and a liquid crystal display device that are integrated.

SUMMARY OF THE INVENTION

An object of the present invention is to solve the above-described problems and provide an image display device where an image display panel and a touch panel are connected through wires in one flexible printed circuit in such a manner that the image display panel and the touch panel are connected through wires with high precision, and no problems arise, such as the portion that has once been connected disengaging.

In order to achieve the above-described object, the invention makes the following means available.

(1) An image display device having an image display panel and a touch panel provided on the front surface of the image display panel, characterized in that wires connected to the image display panel and wires connected to the touch panel are provided in one flexible printed circuit, and the flexible printed circuit is first connected to terminals in the image display panel and then connected to terminals in the touch panel.

(2) The image display device according to the above (1), characterized in that the flexible printed circuit is connected to the image display panel and the touch panel using anisotropic conductive films, and the glass transition temperature of the resin that forms the anisotropic conductive film used for the connection between the image display panel and the flexible printed circuit is higher than that of the anisotropic conductive film used for the connection between the touch panel and the flexible printed circuit.

(3) The image display device according to the above (1) or (2), characterized in that the touch panel has terminal electrodes provided on the two sides, front and rear, of the touch panel substrate, and wires connected to the terminal electrodes on each side of the touch panel are provided in the flexible printed circuit.

(4) An image display device having an image display panel and a touch panel provided on the front surface of the image display panel, characterized in that the touch panel has front terminal electrodes provided on the front surface of the touch panel substrate and rear terminal electrodes provided on the rear surface of the touch panel substrate, the touch panel comprises wires connected to the front terminal electrodes and the rear terminal electrodes in one flexible printed circuit, and the front terminal electrodes and the rear terminal electrodes on the touch panel are respectively connected to the flexible printed circuit using anisotropic conductive films in such a manner that the glass transition temperature of the resin that forms the anisotropic conductive film is different between the anisotropic conductive film used for the front terminal electrodes and the anisotropic conductive film used for the rear terminal electrodes.

(5) The image display device according to the above (4), characterized in that the image display panel and the touch panel are made to make close contact with each other with a transparent resin layer in between.

(6) The image display device according to the above (5), characterized in that the image display device further comprises a front panel, which is made to make close contact with the touch panel with a transparent resin layer in between.

(7) The image display device according to the above (4), characterized in that the front terminal electrodes and the rear terminal electrodes are provided along the same side when the touch panel is viewed from the top.

(8) The image display device according to the above (7), characterized in that the image display panel and the touch panel are connected through one flexible printed circuit, the image display panel and the flexible printed circuit are connected through a first anisotropic conductive film, front terminal electrodes of the touch panel and the flexible printed circuit are connected through a second anisotropic conductive film, rear terminal electrodes of the touch panel and the flexible printed circuit are connected through a third anisotropic conductive film, the glass transition temperature of the resin that forms the anisotropic conductive film is different between the second anisotropic conductive film and the third anisotropic conductive film, and the front terminal electrodes and the rear terminal electrodes are located in different places, and the second anisotropic film and the third anisotropic conductive film are located in different places when the touch panel is viewed from the top.

(9) The image display device according to the above (8), characterized in that the front terminal electrodes and the rear terminal electrodes are respectively formed of a number of terminals in such a manner that the intervals at which the terminals are located are smaller for the front terminal electrodes than for the rear terminal electrodes, and the glass transition temperature of the resin that forms the second anisotropic conductive film is higher than the glass transition temperature of the resin that forms the third anisotropic conductive film.

According to the present invention, one flexible printed circuit has wires connected to an image display panel and wires connected to a touch panel in such a manner that the flexible printed circuit is first connected to the image display panel and then connected to the touch panel. The flexible printed circuit is connected with high precision to the image display panel where the intervals between the wires is smaller, and then the flexible printed circuit is connected to the touch panel where the intervals between the wires is greater than in the image display panel, and thus the connections to the flexible printed circuit can be prevented from being defective.

In addition, the flexible printed circuit is connected to the image display panel and the touch panel using anisotropic conductive films where the glass transition temperature of the resin that forms the anisotropic conductive film is higher for the anisotropic conductive film used for the connection to the image display panel than for the anisotropic conductive film used for the connection to the touch panel, and therefore it is possible to prevent such a problem as the previous connection to the liquid crystal panel disengaging from occurring when the touch panel and the flexible printed circuit are connected to each other.

BRIEF DESCRIPTION OF THE DRAWINGS

FIG. 13 is a cross-sectional diagram showing an image display device where a liquid crystal panel, which is an image display panel, and a touch panel are made to make close contact with each other with a transparent resin layer in between;

FIG. 14 is a cross-sectional diagram showing an image display device where the front panel and the touch panel are made to make close contact with the image display panel with a transparent resin layer in between;

FIG. 16 is a cross-sectional diagram showing the structure of the image display device shown in FIG. 15 with which a front panel is made to make contact with a transparent resin layer in between;

DESCRIPTION OF THE EMBODIMENTS

The image display device according to the present invention is described below in detail.

Figure 4:
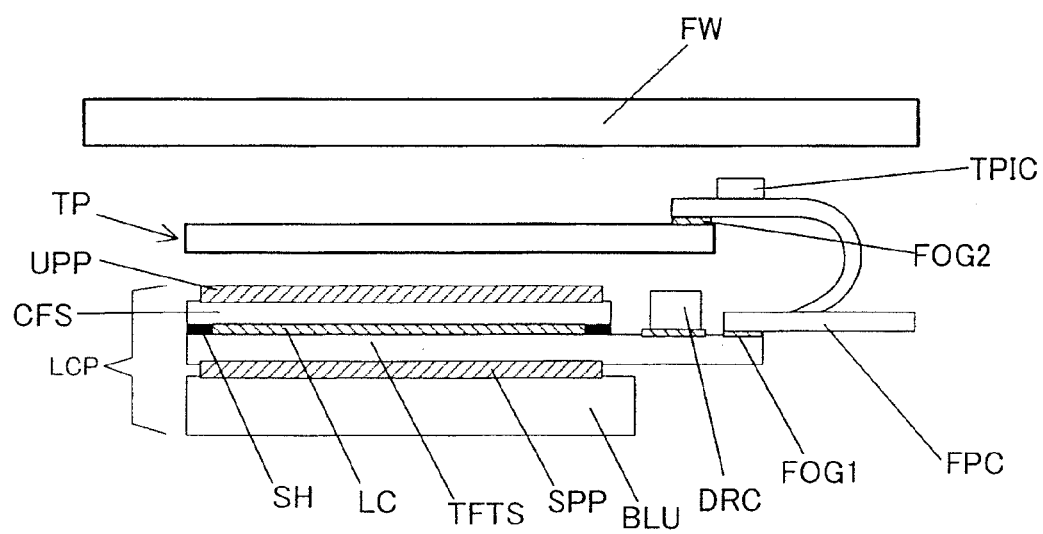
FIG. 4 is a cross-sectional diagram showing the image display device according to the present invention having a liquid crystal panel, which is an image display panel, and a touch panel.

As shown in FIG. 4, the image display device according to the present invention is a liquid crystal display device having a liquid crystal panel LCP and a touch panel TP provided on the front surface of the liquid crystal panel is characterized in that wires connected to the liquid crystal panel and wires connected to the touch panel are included in one flexible printed circuit FPC, which is first connected (FOG1) to the liquid crystal panel (specifically, a TFT substrate (TFTS)) and then connected (FOG2) to the touch panel.

Here, the image display device according to the present embodiment is described using a liquid crystal display device as an example. However, the image display device is not limited to a liquid crystal display device and may be other image display devices, such as an organic electroluminescent display device. Therefore, the liquid crystal panel in the following description may be other image display panels.

Figure 1:
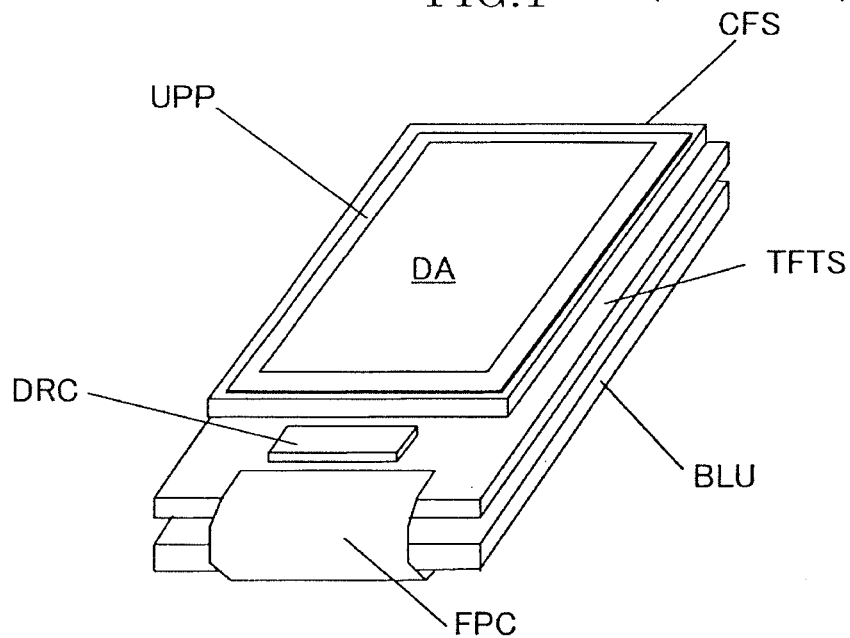
FIG. 1 is a perspective diagram showing a conventional liquid crystal display device.
Figure 2:
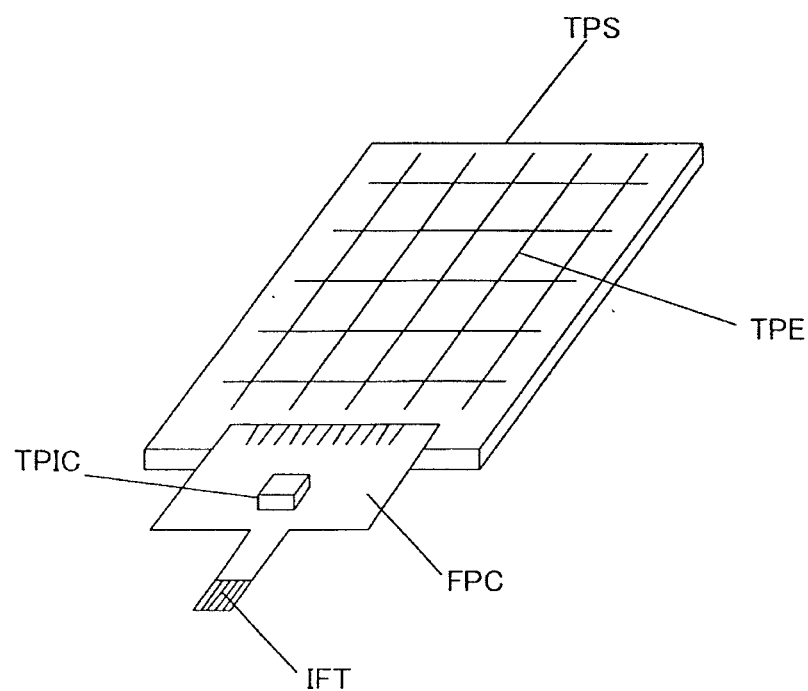
FIG. 2 is a perspective diagram showing a touch panel.
Figure 3:
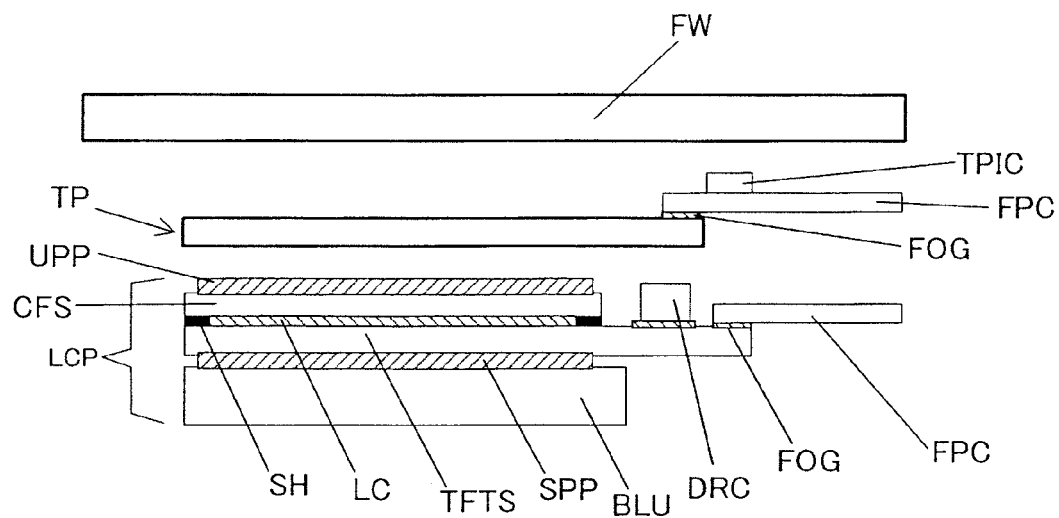
FIG. 3 is a cross-sectional diagram showing a conventional liquid crystal display device having a liquid crystal panel and a touch panel.

It is possible to form the liquid crystal panel and the touch panel used in the image display device according to the present invention by adopting the structure of a publicly known liquid crystal display device, such as that shown in FIGS. 1 to 3, of which the description is omitted here. The symbols used in the embodiments according to the present invention shown in FIGS. 4 to 19 are basically the same as the symbols used in FIGS. 1 to 3.

In the liquid crystal display device, which is the image display device according to the present invention, first, the flexible printed circuit and the liquid crystal panel, which is an image display panel, are connected to each other, and then the flexible printed circuit and the touch panel are connected to each other. As a result, it is possible to connect the flexible printed circuit to the liquid crystal panel, where the intervals between the wires are smaller, with high precision in the same manner as in the prior art because no other panels are connected to the flexible printed circuit. Next, the flexible printed circuit is connected to the touch panel of which the task is hindered by the liquid crystal panel connected to the flexible printed circuit. However, the intervals between the wires on the touch panel are greater that on the liquid crystal panel, and therefore no connections become defective even when the connections slide somewhat. As a result, the connections of the flexible printed circuit to the liquid crystal panel and the touch panel can be prevented from being defective.

The liquid crystal panel LCP, which is an image display panel, has image display panel terminal electrodes for the connection with the flexible printed circuit FPC, whereas the touch panel TP has touch panel terminal electrodes TPC (TPC1 and TPC2, see FIG. 19) for the connection with the flexible printed circuit FPC. The flexible printed circuit FPC has terminals for the image display panel LCPT for the connection with the image display panel terminal electrodes and terminals for the touch panel TPT for the connection with the touch panel terminal electrodes TPC (see FIG. 5).

In the image display device according to the present invention, as shown in FIG. 4, the flexible printed circuit FPC is connected to the liquid crystal panel and the touch panel using anisotropic conductive films, where the glass transition temperature Tg of the resin that forms the anisotropic conductive film is higher for the first anisotropic conductive film (FOG1) used for the connection between the liquid crystal panel and the flexible printed circuit than for the second anisotropic conductive film (FOG2) used for the connection between the touch panel and the flexible printed circuit.

The anisotropic conductive films have such a structure that conductive particles are dispersed within an insulating and adhesive resin film. According to the method for adhesion using an anisotropic conductive film, an anisotropic conductive film is intervened between the liquid crystal panel, which is an image display panel, and the flexible printed circuit or between the touch panel and the flexible printed circuit, and a press head heated to approximately 180° C. is pressed against the connection portion so that the two are connected to each other.

According to the present invention, the glass transition temperature of the resin that forms the anisotropic conductive film is higher for the anisotropic conductive film used for the connection with the liquid crystal panel than for the anisotropic conductive film used for the connection with the touch panel, and therefore it is possible to prevent such a problem that the previous connection with the liquid crystal panel disengages or slides from occurring due to the heat for the connection between the touch panel and the flexible printed circuit after the connection with the liquid crystal panel.

Figure 5:
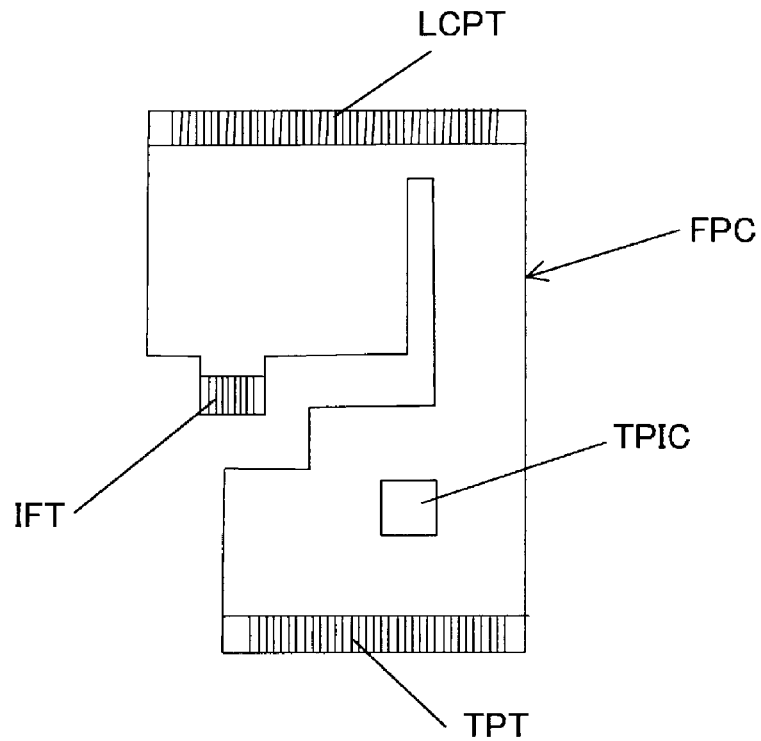
FIG. 5 is a plan diagram showing a flexible printed circuit used in the image display device according to the present invention (in the case where terminals for the image display panel LCPT and terminals for the touch panel TPT are located along the facing sides)
Figure 6:
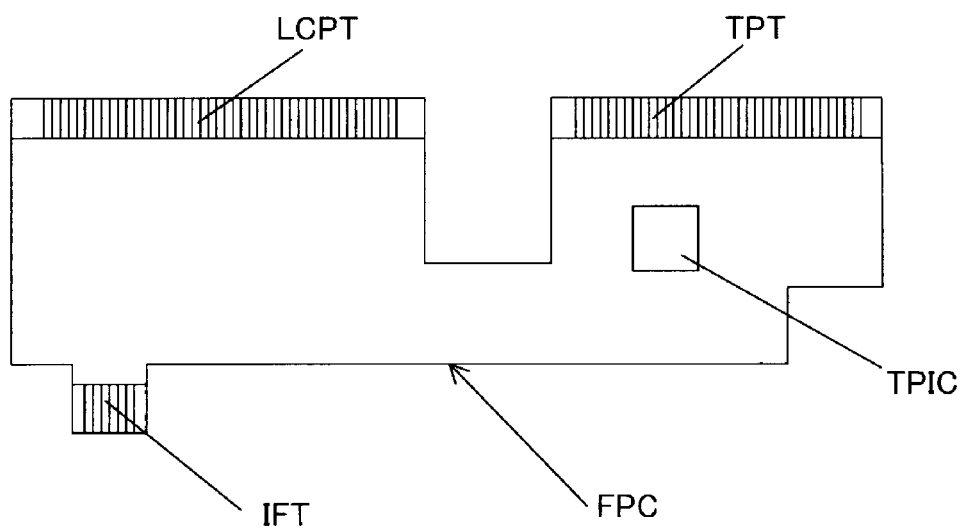
FIG. 6 is a plan diagram showing a flexible printed circuit used in the image display device according to the present invention (in the case where terminals for the image display panel LCPT and terminals for the touch panel TPT are located along sides on the same side)

It is possible to adopt various forms for the flexible printed circuit connected to the liquid crystal panel and the touch panel as those where terminals for the liquid crystal panel (LCPT) and terminals for the touch panel (TPT) are located in the positions along the facing sides as shown in FIG. 5, and those where terminals for the liquid crystal panel (LCPT) and terminals for the touch panel (TPT) are located in the positions along sides on the same side as shown in FIG. 6.

Figure 7:
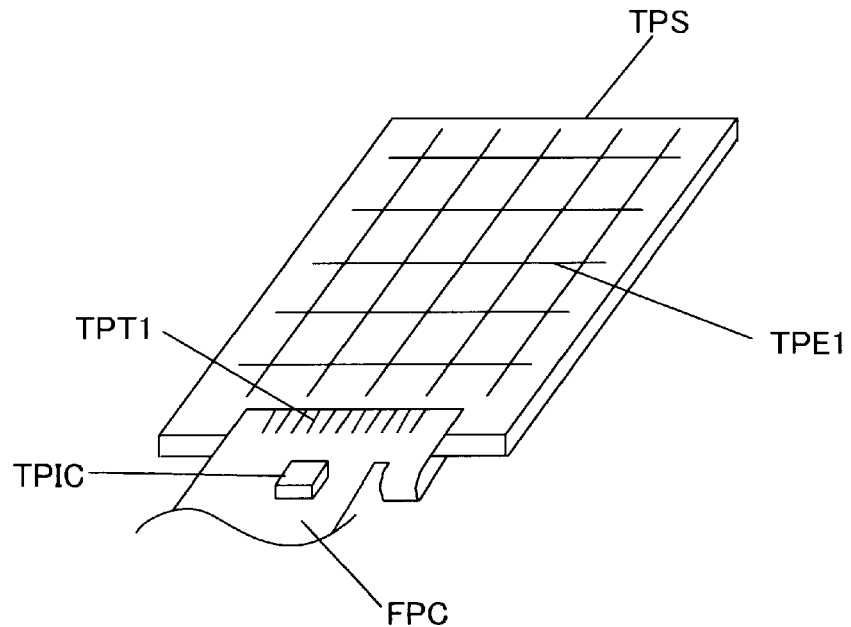
FIG. 7 is a perspective diagram showing a touch panel having electrodes for the touch panel on the two sides.
Figure 8:
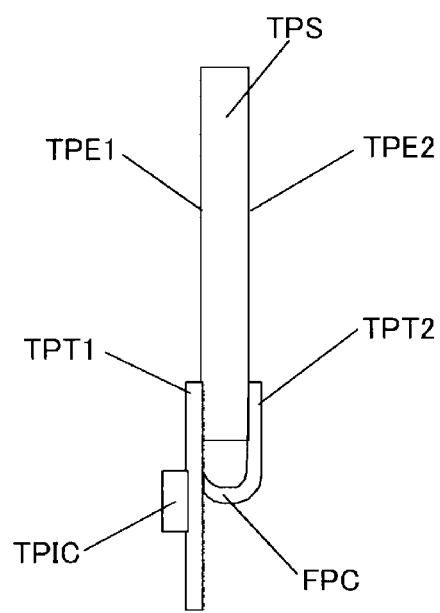
FIG. 8 is a cross-sectional diagram showing the touch panel in FIG. 7.
Figure 9:
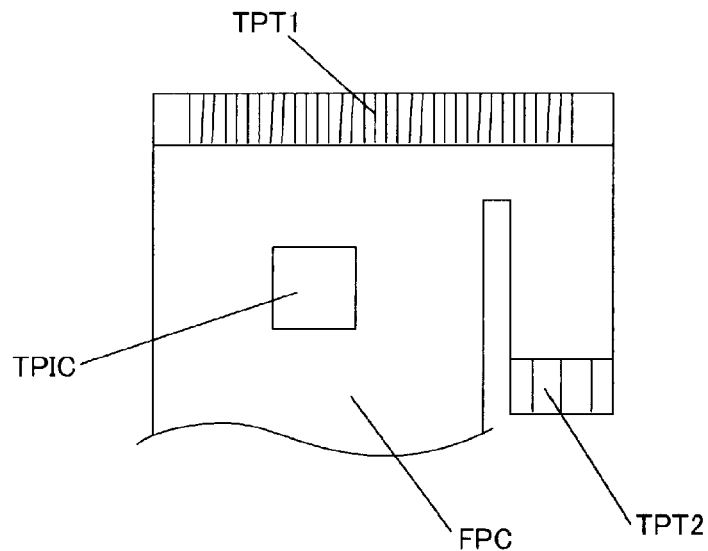
FIG. 9 is a plan diagram showing a flexible printed circuit used for the touch panel shown in FIGS. 7 and 8.

Next, the embodiment shown in FIGS. 7 to 9 is described, where wires are connected to a touch panel through electrodes (TPE1, TPE2) provided on the two sides of a touch panel substrate (TPS) in such a manner that the wires are included in one flexible printed circuit FPC.

FIGS. 7 and 8 are a perspective diagram (FIG. 7) and a cross-sectional diagram (FIG. 8) showing a touch panel having electrodes for the touch panel (TPE1, TPE2) on the two sides of a touch panel substrate (TPS) formed of an insulating substrate having high transparency for light. The plan diagram of FIG. 9 shows an example of a flexible printed circuit used for the touch panel in FIG. 7. A driving IC (TPIC) for driving the touch panel is mounted on part of the flexible printed circuit. In addition, two portions of terminals TPT1 and TPT2 are provided on the flexible printed circuit as the terminals for the touch panel connected to the electrodes on the two sides, front and rear, of the touch panel. The connection between the touch panel and the flexible printed circuit is FOG contact bonds using anisotropic conductive films.

Figure 17:
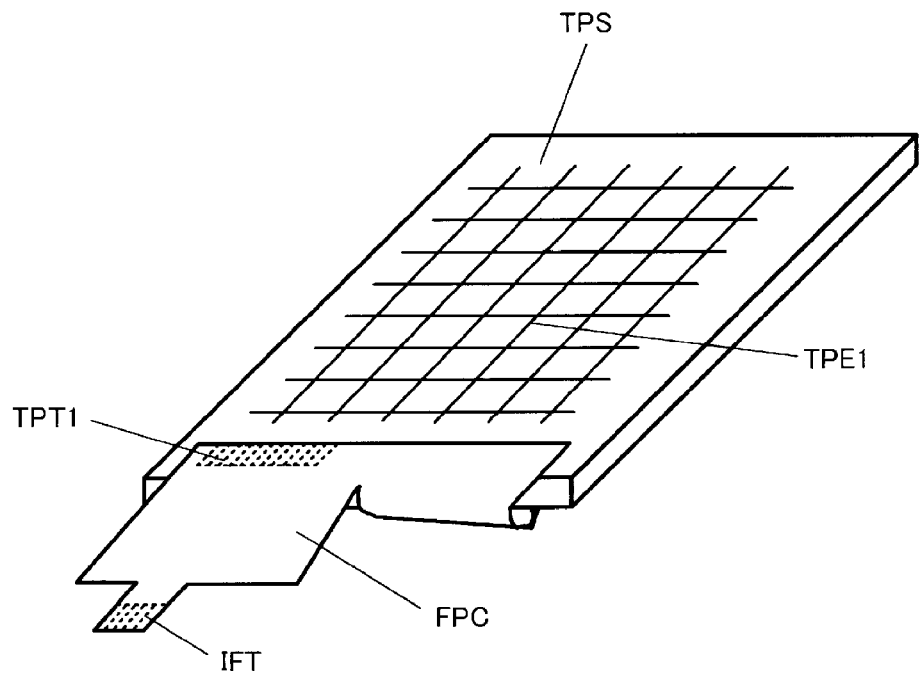
FIG. 17 is a perspective diagram showing a touch panel used in the image display device according to the present invention.
Figure 18:
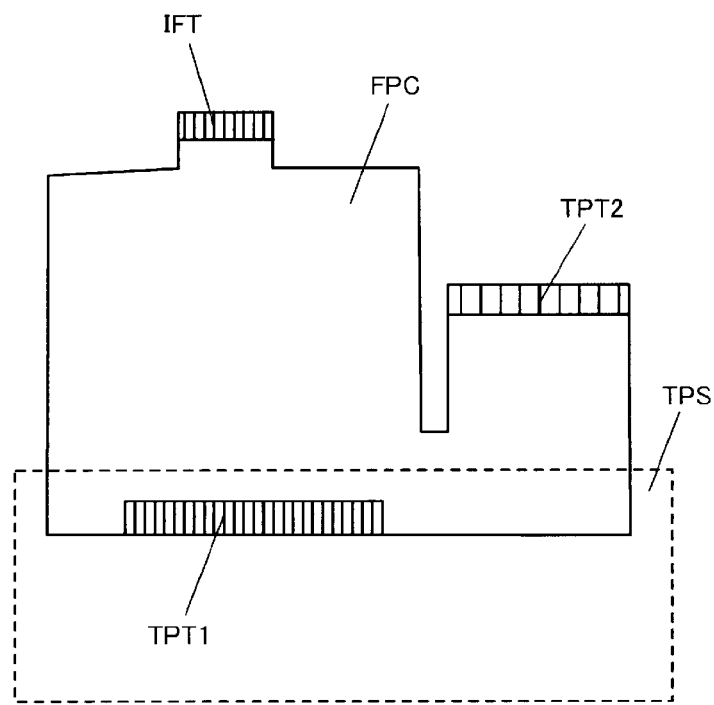
FIG. 18 is a plan diagram showing a flexible printed circuit used for the touch panel in FIG. 17.
Figure 19:
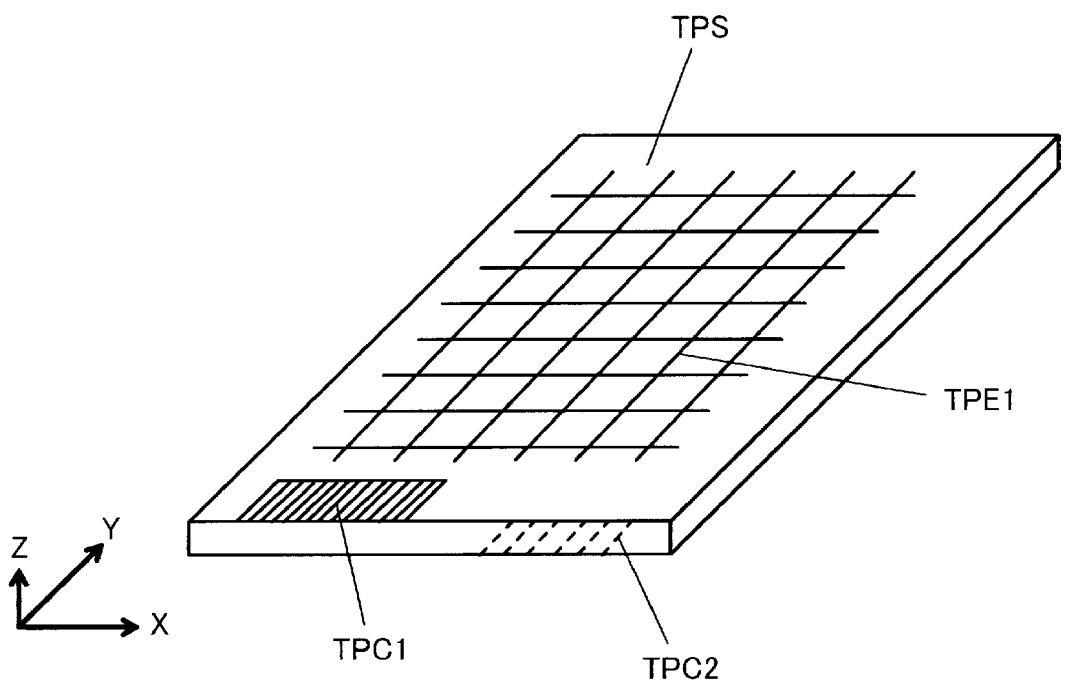
FIG. 19 is a perspective diagram showing a touch panel substrate used for the touch panel in FIG. 17.

FIGS. 17 to 19 show a touch panel having electrodes for the touch panel (TPE1) on the two sides of the touch panel substrate TPS in the same manner as in FIG. 7. As shown in FIG. 19, the touch panel terminal electrodes TPC on the touch panel TP include front terminal electrodes TPC1 provided on the front surface of the touch panel substrate and rear terminal electrodes TPC2 provided on the rear surface of the touch panel. The front terminal electrodes TPC1 on the touch panel are connected to the flexible printed circuit FPC through a second anisotropic conductive film FOG2, and the rear terminal electrodes TPC2 on the touch panel are connected to the flexible printed circuit FPC through a third anisotropic conductive film FOG3. The glass transition temperature of the resin that forms the anisotropic conductive film is different between the second anisotropic conductive film FOG2 and the third anisotropic conductive film FOG3.

Figure 10:
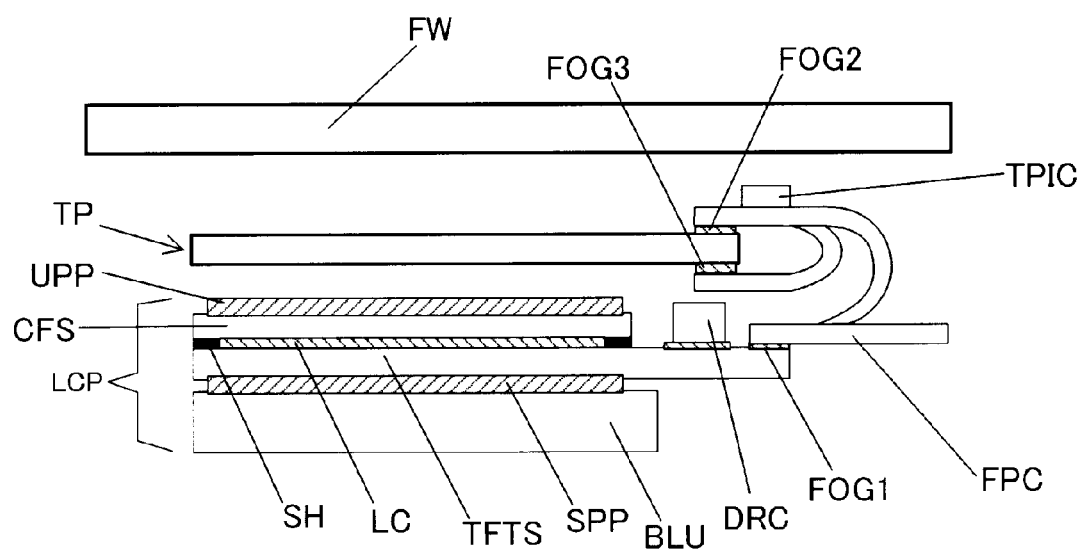
FIG. 10 is a cross-sectional diagram showing an image display device having the touch panel shown in FIG. 7.

FIG. 10 is a cross-sectional diagram showing the liquid crystal display device with a touch panel having electrodes for the touch panel on the two sides shown in FIG. 7. Flexible printed circuits that can be used in the liquid crystal display device in FIG. 10 include those where terminals for the liquid crystal panel (LCPT) and terminals for the touch panel (TPT1) are located along the facing sides as in FIG. 11 and those where terminals for the liquid crystal panel (LCPT) and terminals for the touch panel (TPT1) are located along sides on the same side as in FIG. 12.

It should be noted that the intervals of the wires for the connection on the touch panel are smaller for those represented by TPT1 than those represented by TPT2. As a result, the terminals to be connected to the wires with smaller intervals should be provided along the outer periphery of the flexible printed circuit as represented by TPT1 in order to increase the efficiency for the connection task.

Figure 11:
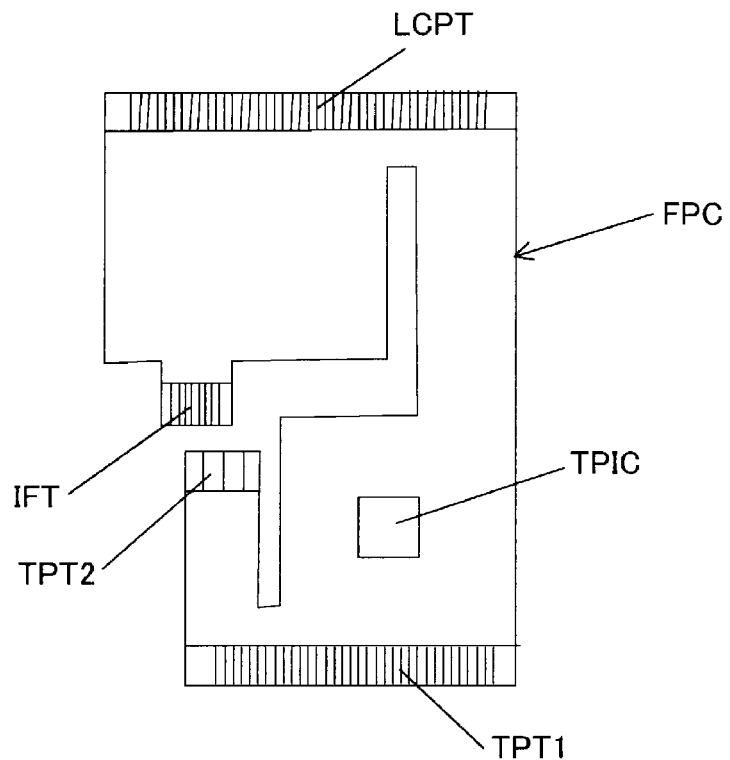
FIG. 11 is a plan diagram showing a flexible printed circuit used in the image display device shown in FIG. 10 (in the case where terminals for the image display panel LCPT and terminals for the touch panel TPT1 are located along the facing sides)
Figure 12:
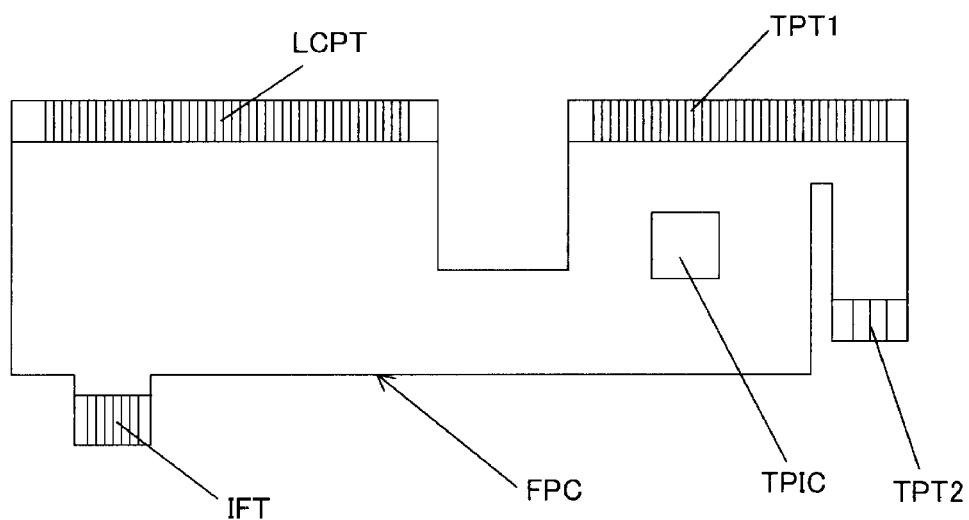
FIG. 12 is a plan diagram showing a flexible printed circuit used in the image display device shown in FIG. 10 (in the case where terminals for the image display panel LCPT and terminals for the touch panel TPT1 are located along sides on the same side)

As shown in FIGS. 11 and 12, the flexible printed circuit has connection terminals in three locations, LCPT, TPT1 and TPT2. Therefore, the terminals for the liquid crystal panel (LCPT) are connected to the liquid crystal panel, and then the touch panel is connected.

When the flexible printed circuit is connected to the touch panel through the terminals on the two sides, the wires with small intervals are connected first, and the terminals for the touch panel (TPT2) with greater intervals are connected to the wires second. Furthermore, the glass transition temperature Tg of the resin that forms the anisotropic conductive film (FOG1 to FOG3 in FIG. 3) is always higher for the anisotropic conductive film used for the first connection than that of the anisotropic conductive film used for the following connection (FOG1>FOG2>FOG3 for Tg).

Figure 13:
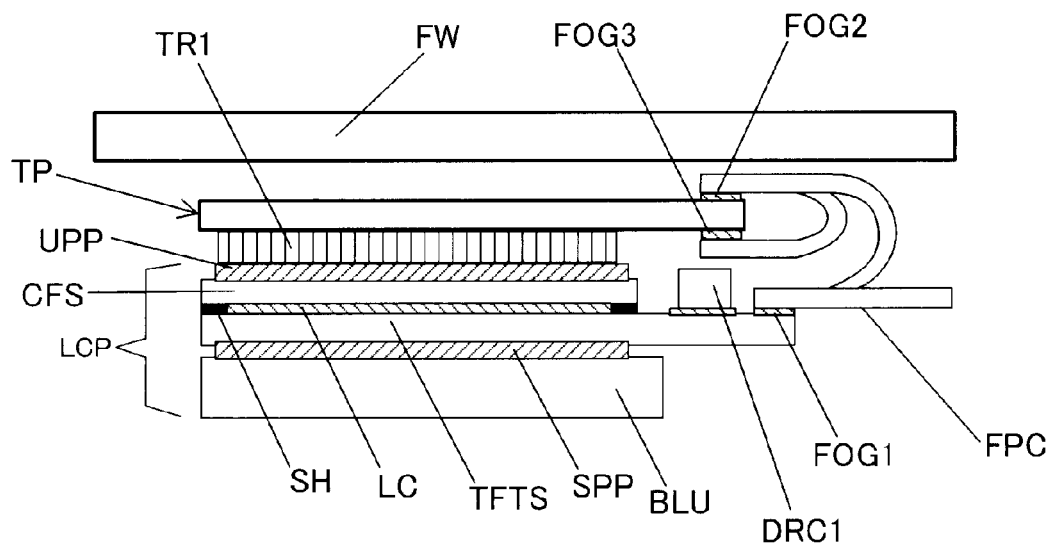
Figure 14:
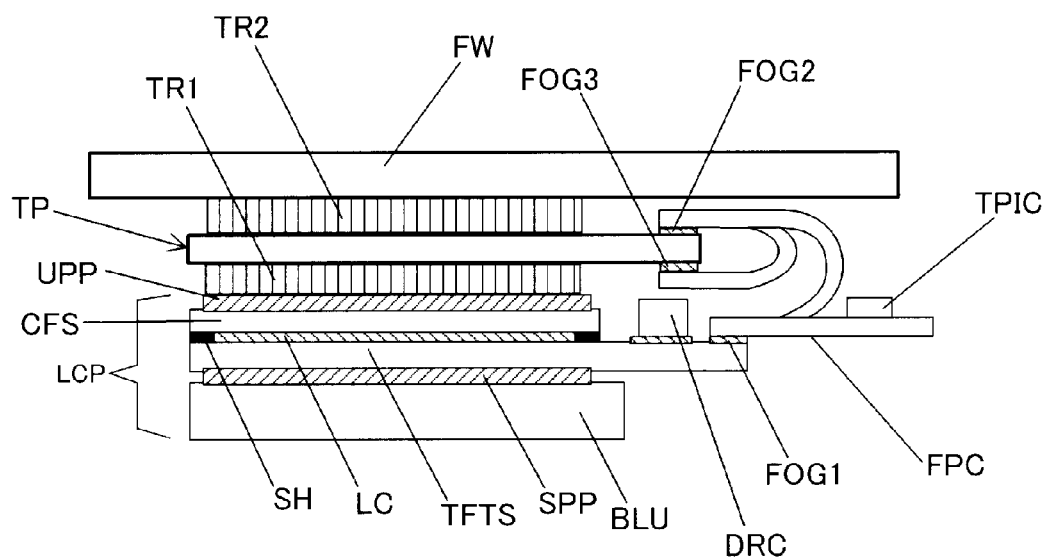

As shown in FIG. 13, it is possible for the liquid crystal panel (LCP) and the touch panel (TP) to be made to make close contact with a transparent resin layer (TR1) in between, and in addition, as shown in FIG. 14, it is possible for the front panel (FW) and the touch panel to be made to make close contact with a transparent resin layer (TR2) in between. By adopting this structure, the thickness of the liquid crystal display device as a whole can be reduced, and in addition the mechanical strength of the display device as a whole can be increased.

As shown in FIG. 13, an advantage of the connection between the liquid crystal panel LCP and the touch panel TP using one flexible printed circuit FPC can be used in the integration of a circuit for driving the touch panel TP into the driver chip (DRC1) mounted on the liquid crystal panel so that the driving IC for the touch panel can be omitted, which makes it possible to reduce the number of parts and the cost for manufacture.

As shown in FIG. 14, the driving IC (TPIC) for driving the touch panel is mounted on the part of the flexible printed circuit FPC that is the farthest from the front panel FW in the direction of the thickness of the liquid crystal display device (upward and downward direction in the figure). As a result, the driving IC (TPIC) can be prevented from interfering with the front panel (FW) due to its position, which contributes to the reduction in the thickness of the device as a whole.

Figure 15:
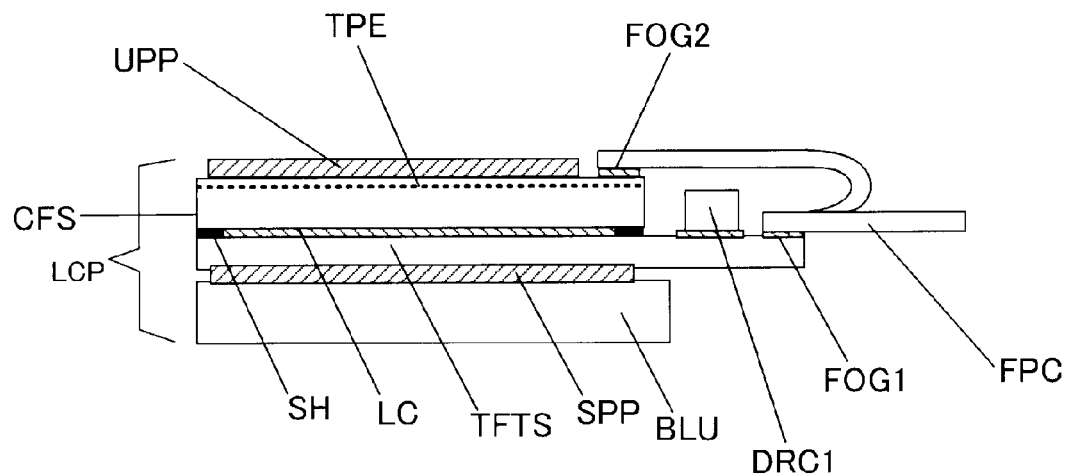
FIG. 15 is a cross-sectional diagram showing an image display device where a touch panel is incorporated into part of an image display panel.

FIG. 15 is a cross-sectional diagram showing a liquid crystal display device where a touch panel is integrated into part of a liquid crystal panel LCP. Concretely, electrodes for the touch panel (TPE) are formed on the surface of a color filter substrate (facing substrate, CFS) that forms the liquid crystal panel LCP. Naturally, terminal electrodes TPC are connected to the electrodes for the touch panel, and the terminal electrodes TPC and the flexible printed circuit FPC are connected through an FOG contact bond (FOG2). In addition, a circuit for driving the touch panel TP is integrated in the driver chip (DRC1) mounted on the liquid crystal panel in the same manner as in the embodiment in FIG. 13.

Figure 16:
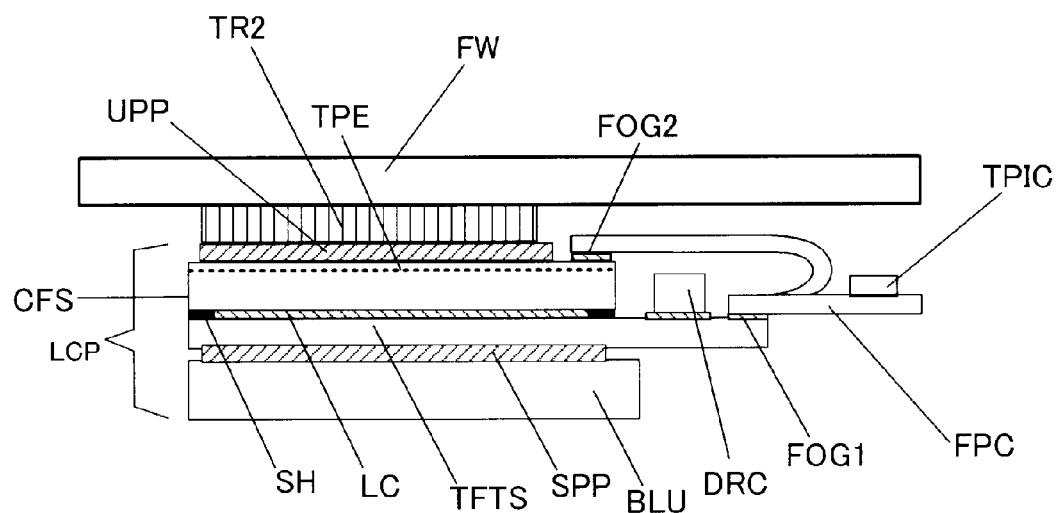

FIG. 16 shows the liquid crystal display device in FIG. 15 to which the structure for making the front panel (FW) make close contact with the liquid crystal panel with a transparent resin layer (TR2) in between. The structure in FIG. 16 makes it possible to further increase the advantage of the liquid crystal display panel where the thickness is reduced by integrating the touch panel into the liquid crystal panel. In addition, the driving IC (TPIC) for driving the touch panel is mounted on the part of the flexible printed circuit FPC that is the farthest from the front panel (FW) in the direction of the thickness (upward and downward direction in the figure) of the liquid crystal display device in the same manner as in the embodiment in FIG. 14.

FIG. 17 is a perspective diagram showing a touch panel substrate TPS to which a flexible printed circuit FPC is connected. This is different from that in FIG. 7 in the location where the terminals for the touch panel TPT on the flexible printed circuit are connected to the touch panel terminal electrodes TPC on the touch panel TP. In FIG. 17, the location along a side where the terminals for the touch panel TPT are connected to the touch panel terminal electrodes TPC is different between the upper side of the touch panel and the lower side of the touch panel when the touch panel having the flexible printed circuit is viewed from the top.

FIG. 18 is a plan diagram showing the flexible printed circuit FPC in FIG. 17 where first terminals for the touch panel TPT1 and second terminals for the touch panel TPT2 are along the facing sides. The first terminals for the touch panel TPT1 on the flexible printed circuit are first connected to the front terminal electrodes TPC1 in FIG. 19, and then the portion with the second terminals for the touch panel TPT2 is folded back in order to be connected to the rear terminal electrodes TPC2.

The touch panel terminal electrodes TPC on the touch panel TP include front terminal electrodes TPC1 provided on the front surface of the touch panel substrate TPS and rear terminal electrodes TPC2 provided on the rear surface of the touch panel substrate TPS in the same manner as in FIGS. 7 and 8. Here, the front surface is the side where the observer sees an image displayed on the image display device, and the rear surface is the image display panel side. The front terminal electrodes TPC1 are connected to the flexible printed circuit through a second anisotropic conductive film FOG2 while the rear terminal electrodes TPC2 are connected to the flexible printed circuit through a third anisotropic conductive film FOG3 in the same manner as in FIG. 10.

Furthermore, in the touch panel in FIG. 17, the front terminal electrodes TPC1 and the rear terminal electrodes TPC2 are located along the same side when viewed from the top. This structure makes the interface IFT of the flexible printed circuit FPC be concentrated in one portion, which makes the connection with an external apparatus easier.

FIG. 19 is a perspective diagram showing the substrate TPS of the touch panel TP in FIG. 17 where the direction of the short sides of the rectangular touch panel is the direction X, the direction of the long sides is the direction Y and the direction of the thickness is the direction Z. The front terminal electrodes TPC1 and the rear terminal electrodes TPC2 on the touch panel are along a side in the direction X in different locations. The front terminal electrodes TPC1 are connected to the front electrodes TPE1 that form the touch panel, whereas the rear terminal electrodes TPC2 are connected to the rear electrodes TPE2 that form the touch panel. The front electrodes TPE1 are touch panel electrodes made of electrodes running in the direction X and in the direction Y, for example. The rear electrodes TPE2 are a transparent conductive film for shielding the noise emitted by the display panel, for example.

The front terminal electrodes TPC1 on the touch panel and the first terminals for the touch panel TPT1 on the flexible printed circuit FPC are connected through the second anisotropic conductive film FOG2, whereas the rear terminal electrodes TPC2 on the touch panel and the second terminals for the touch panel TPT2 on the flexible printed circuit FPC are connected through the third anisotropic conductive film FOG3.

According to the present invention, the front terminal electrodes TPC1 and the rear terminal electrodes TPC2 are located along one side of the rectangular touch panel in different locations. No other terminal electrodes are on the rear side of terminal electrodes in the same location, and therefore the flexible printed circuit FPC can be prevented from sliding due to the heat when heat and pressure are applied to one side for the thermal connection using the anisotropic conductive film.

In addition, the glass transition temperature of the resin that forms the anisotropic conductive film may be different between the second anisotropic conductive film FOG2 and the third anisotropic film FOG3.

Furthermore, the front terminal electrodes FPC1 and the rear terminal electrodes FPC2 are made of a number of terminals. The intervals between the terminals for the front terminal electrodes TPC1 are smaller than the intervals between the rear terminal electrodes TPC2. In this relationship, the glass transition temperature of the resin in the second anisotropic conductive film may be higher than the glass transition temperature of the resin in the third anisotropic conductive film.

Though not shown in FIG. 17 or 18, the image display panel and the touch panel may be connected using one flexible printed circuit as in FIG. 11. In addition, the touch panel in FIG. 17 may be made to make close contact with the image display panel with a transparent resin layer in between. Furthermore, a front panel may be provided on the front surface of the touch panel with a transparent resin layer in between. Here, in these embodiments, the front terminal electrodes TPC1 and the rear terminal electrodes TPC2 are located along one side of the touch panel in different locations in the structure as described above so that the same working effect can be expected.

As described above, the present invention can provide a liquid crystal display device where a liquid crystal panel and a touch panel are connected through wires in one flexible printed circuit in such a manner that the liquid crystal panel and the touch panel are connected through wires with high precision, and no problems arise, such as the portion that has once been connected disengaging. Furthermore, according to the present invention, a flexible printed circuit FPC can be secured to the two sides, front and rear, of one substrate with high precision by applying heat and pressure to anisotropic conductive films on the substrate.

What is claimed is:

1. An image display device comprising an image display panel and a touch panel provided on the front surface of the image display panel, wherein
   first wires connected to the image display panel and second wires connected to the touch panel are provided in one flexible printed circuit, and
   the flexible printed circuit has a first connection and a second connection connected in an order of the first connection and the first wires being firstly connected to terminals in the image display panel and then the second connection and the second wires being secondly connected to terminals in the touch panel;
   wherein both of the first and second wires and the first and second connections have different properties so as to enable connection of the flexible printed circuit with the image display panel and with the touch panel with high precision and without becoming defective.

2. The image display device according to claim 1, wherein the flexible printed circuit is connected to the image display panel and the touch panel using anisotropic conductive films, and the different properties of the first connection and the second connection include the glass transition temperature of the resin that forms the anisotropic conductive film used for the first connection between the image display panel and the flexible printed circuit is higher than the glass transition temperature of the resin that forms the anisotropic conductive film used for the second connection between the touch panel and the flexible printed circuit.

3. The image display device according to claim 1 or 2, wherein the touch panel has terminal electrodes provided on the two sides, front and rear, of the touch panel substrate, and the second wires connected to the terminal electrodes on each side of the touch panel are provided in the flexible printed circuit.

4. The image display device according to claim 1, wherein the different properties of the first wires and the second wires include that intervals between the second wires connected to the touch panel are greater than intervals between the first wires connected to the image display panel.

5. An image display device comprising an image display panel and a touch panel provided on the front surface of the image display panel, wherein
   the touch panel has front terminal electrodes provided on the front surface of the touch panel substrate and rear terminal electrodes provided on the rear surface of the touch panel substrate,
   the touch panel comprises wires connected to the front terminal electrodes and wires connected to the rear terminal electrodes in one flexible printed circuit, and
   the front terminal electrodes and the rear terminal electrodes on the touch panel are respectively connected to the flexible printed circuit using anisotropic conductive films in such a manner that the glass transition temperature of the resin that forms the anisotropic conductive film is different between the anisotropic conductive film used for the front terminal electrodes and the anisotropic conductive film used for the rear terminal electrodes.

6. The image display device according to claim 5, wherein the image display panel and the touch panel are made to make close contact with each other with a transparent resin layer in between.

7. The image display device according to claim 6, wherein the image display device further comprises a front panel, which is made to make close contact with the touch panel with a transparent resin layer in between.

8. The image display device according to claim 5, wherein the front terminal electrodes and the rear terminal electrodes are provided along the same side when the touch panel is viewed from the top.

9. The image display device according to claim 8, wherein
   the image display panel and the touch panel are connected through one flexible printed circuit,
   the image display panel and the flexible printed circuit are connected through a first anisotropic conductive film,
   front terminal electrodes of the touch panel and the flexible printed circuit are connected through a second anisotropic conductive film, rear terminal electrodes of the touch panel and the flexible printed circuit are connected through a third anisotropic conductive film, the glass transition temperature of the resin that forms the anisotropic conductive film is different between the second anisotropic conductive film and the third anisotropic conductive film, and the front terminal electrodes and the rear terminal electrodes are located in different places, and the second anisotropic film and the third anisotropic conductive film are located in different places when the touch panel is viewed from the top.

10. The image display device according to claim 9, wherein the front terminal electrodes and the rear terminal electrodes are respectively formed of a number of terminals in such a manner that the intervals at which the terminals are located are smaller for the front terminal electrodes than for the rear terminal electrodes, and the glass transition temperature of the resin that forms the second anisotropic conductive film is higher than the glass transition temperature of the resin that forms the third anisotropic conductive film.

\* \* \* \* \*